(12) United States Patent
Van Liere

(10) Patent No.: US 8,049,505 B2
(45) Date of Patent: Nov. 1, 2011

(54) MRI SYSTEM WITH DIRECT DIGITAL RECEIVER USING RESAMPLING

(75) Inventor: Filips Van Liere, Eindhoven (NL)

(73) Assignee: Koninlijke Philips Electronics N.V., Eindhoven (NL)

( * ) Notice: Subject to any disclaimer, the term of this patent is extended or adjusted under 35 U.S.C. 154(b) by 76 days.

(21) Appl. No.: 12/519,779

(22) PCT Filed: Dec. 13, 2007

(86) PCT No.: PCT/IB2007/055084
§ 371 (c)(1),
(2), (4) Date: Jun. 18, 2009

(87) PCT Pub. No.: WO2008/075268
PCT Pub. Date: Jun. 26, 2008

(65) Prior Publication Data
US 2010/0001725 A1   Jan. 7, 2010

(30) Foreign Application Priority Data
Dec. 19, 2006  (EP) ..................................... 06126486

(51) Int. Cl.
*G01V 3/00* (2006.01)
(52) U.S. Cl. ........................................ 324/322; 324/318
(58) Field of Classification Search .................. 324/322, 324/318
See application file for complete search history.

(56) References Cited

U.S. PATENT DOCUMENTS

| | | |
|---|---|---|
| 4,949,040 A | 8/1990 | Proksa |
| 5,910,752 A * | 6/1999 | Filipovic et al. .............. 329/341 |
| 6,259,253 B1 | 7/2001 | Ellingson |
| 6,624,777 B2 * | 9/2003 | Miyano ......................... 341/155 |
| 6,633,162 B2 * | 10/2003 | Zhang et al. ................... 324/322 |
| 7,807,474 B2 * | 10/2010 | Jesmanowicz ................ 436/173 |
| 2002/0079892 A1 | 6/2002 | Baumgartl et al. |
| 2003/0062901 A1 | 4/2003 | Zhang et al. |
| 2006/0120497 A1 * | 6/2006 | Blasco Claret et al. ........ 375/355 |

FOREIGN PATENT DOCUMENTS

| | | |
|---|---|---|
| EP | 0411840 A2 | 2/1991 |
| EP | 1184980 A2 | 3/2002 |
| JP | 2002300224 | 10/2002 |

OTHER PUBLICATIONS

"Sample Rate Conversion for Digital Audio Processing" Henriquez et al, University of New Orleans, Department of EE, Apr. 1, 1990 p. 233-238I.

"Direct Detection and Time-Locked Subsampling Applied to . . . " Prusley Randall et al, Review of Scientific Instruments, AIP, Melville, NY vol. 76, No. 5, Apr. 26, 2005, p. 53709.

"Undersampling to Acquire Nuclear Magnetic Resonance Images" Perez Santos, Medical Engineering& Physics, vol. 26, 2004, p. 523-529.

"An Area Efficient Implementation of Digital IF QAM Coherent Demodulation . . . " Song et al, VLSI Circuits 2004, Digest of Technical Papers, 2004 Symposium, Jun. 17-19, 2004 p. 160-163.

* cited by examiner

Primary Examiner — Louis Arana

(57) ABSTRACT

The present invention relates to magnetic resonance imaging system and to a direct digital receiver (18) for an RF coil ($D_1$, $D_2$), in particular of a magnetic resonance imaging system. To obtain that the sampling frequency of an analog-to-digital converter (33) of the digital receiver can be chosen independently of the digital operating frequency at which the subsequent digital down converter (38), which particularly includes a demodulator (34), operates, a resampling unit (37) is introduced which is coupled between said analog-to-digital converter and said digital down converter for resampling a first digital sample signal at said sampling frequency to a second digital sample signal at said digital operating frequency.

8 Claims, 12 Drawing Sheets

MRI SYSTEM WITH DIRECT DIGITAL RECEIVER USING RESAMPLING

FIELD OF THE INVENTION

The present invention relates to a magnetic resonance imaging system and a corresponding method having a transmit phase and a receive phase. Further, the present invention relates to a direct digital receiver and a corresponding method for a magnetic resonance coil. Still further, the present invention relates to computer program for implementing said methods on a computer.

BACKGROUND OF THE INVENTION

Magnetic resonance imaging (MRI) devices apply a main magnetic field through an examination region. This strong field, typically denoted $B_0$, acts to align the nuclei within a subject to be examined. In some MRI devices, the $B_0$ field is horizontally oriented, and in others it is vertically oriented.

In both horizontally and vertically oriented systems, magnetic resonance is excited in the aligned nuclei by a relatively strong orthogonal RF field, typically denoted $B_1$. The $B_1$ field causes the aligned nuclei or spins to tip into an plane orthogonal to the static magnetic field $B_0$. Over time, the spins realign themselves with the $B_0$ field emitting relatively weak radio frequency (RF) resonance signals as they process. This resonance is detected by RF coils tuned to the specific resonance frequency desired. These resonance signals are passed to image processing equipment to reconstruct the signals into an image representation for display on a video monitor.

Generally, a direct digital receiver (DDR) comprising an analog-to-digital converter (ADC) that samples the MR signal directly (i.e., without used of an intermediate frequency) and a subsequent digital down converter (DDC) is used to convert the analog MR signal to a digital base-band signal. The sampling frequency ($f_S$), or frequency at which the ADC is operated, is typically much lower than the carrier frequency ($f_C$). According to the Nyquist-Shannon sampling theorem the sampling frequency need only be twice the signal bandwidth (BW) and consequently may be less than the carrier frequency. For MR, the signal bandwidth (limited by the maximum gradient strength and maximum field-of-view) is typically much less than the carrier frequency (defined by the main field strength).

It is common practice to operate the entire DDR at the sampling frequency. In addition the operating frequency is commonly restricted to multiples of a common frequency used to control the timing of the pulse sequences controlling the MR procedure. The combination of these two practices places severe constraints on the design of the anti-aliasing filter required to condition the RF signal prior to digitization.

SUMMARY OF THE INVENTION

It is an object of the present invention to provide a magnetic resonance system and a corresponding method as well as a direct digital receiver and a corresponding method by which the sampling frequency of an analog-to-digital converter of the direct digital receiver can be chosen independently of the frequency at which the subsequent digital down convertor operates. This independence provides additional design freedom in both the analog domain and digital domain.

The object is achieved according to the present invention by a magnetic resonance system comprising an RF receive coil, adapted to resonate in the resonant frequency spectrum, for receiving a magnetic resonance signal during the receive phase; and a direct digital receiver for converting said received magnetic resonance signal to a digital base-band signal, including:
  an analog-to-digital converter for converting said received signal to a first digital sample signal at a sampling frequency,
  a digital down converter for down-mixing a second digital sample signal to a bandwidth limited digital base-band signal having a digital operating frequency, and
  a resampling unit coupled between said analog-to-digital converter and said digital down converter for resampling said first digital sample signal at said sampling frequency to said second digital sample signal at said digital operating frequency.

The object is further achieved according to the present invention by a direct digital receiver as described herein, by corresponding methods as described herein and by a computer program as described herein.

Preferred embodiments of the invention are defined in the dependent claims. It shall be understood that the digital receiver as described herein and the methods as described herein have similar and/or identical preferred embodiments as defined in the dependent claims.

Advantageous embodiments of the resampling unit are described herein. Preferably the resampling unit comprises a transfer unit, an interpolation unit, a counting unit, and a coefficient table unit.

According to another preferred embodiment said digital down converter comprises a demodulator, a low-pass filter and an oscillator for down-mixing and filtering said digital sample signal to said bandwidth limited digital base-band signal having said digital operating frequency.

BRIEF DESCRIPTION OF THE DRAWINGS

The invention will now be explained in more detail with reference to the drawings in which.

DETAILED DESCRIPTION OF EMBODIMENTS

Figure 1:
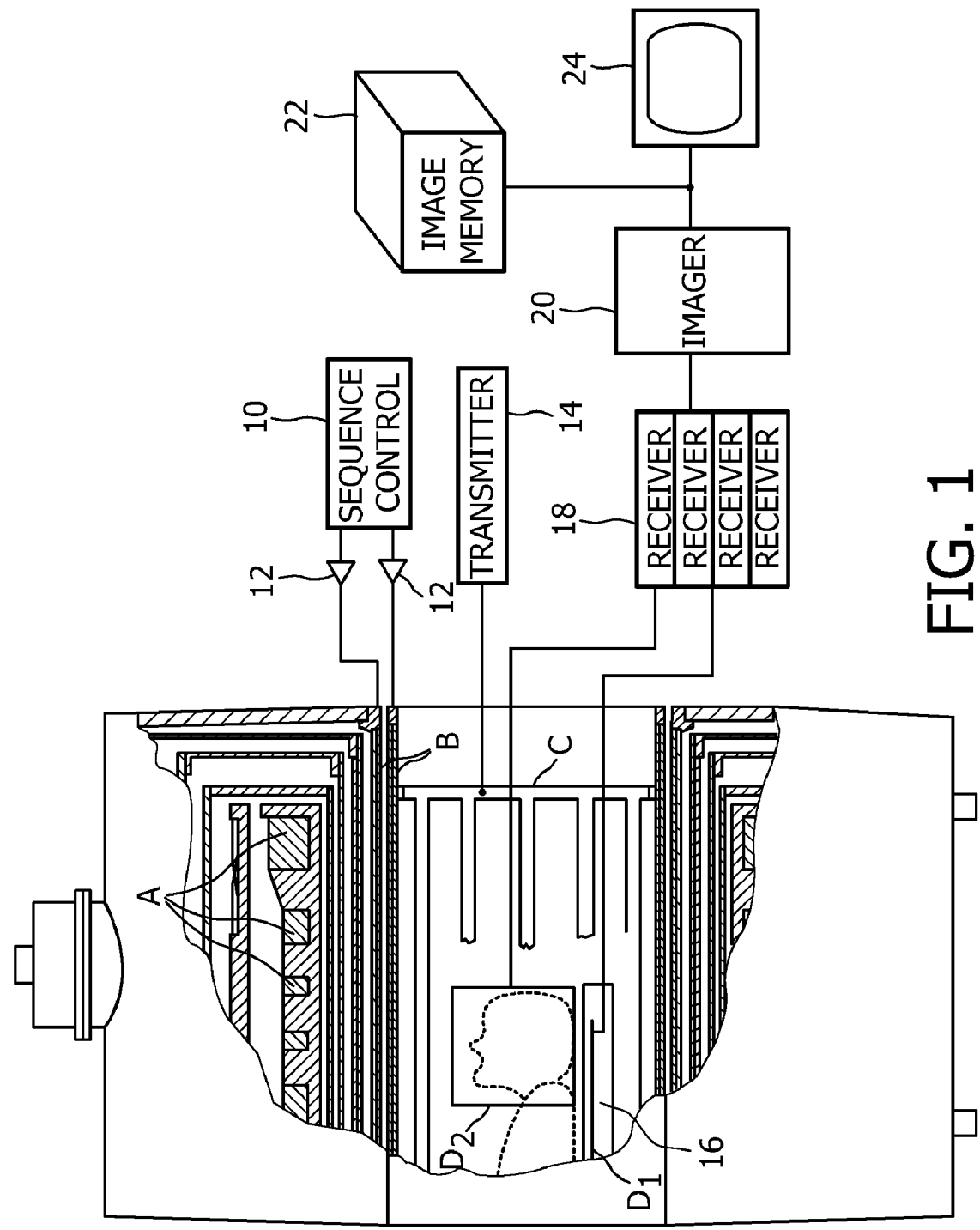
FIG. 1 is a diagrammatic illustration of a magnetic resonance imaging apparatus incorporating the present invention.

With reference to FIG. 1, a magnetic resonance imaging apparatus includes a main magnetic field generator A for establishing a temporally constant, main magnetic field $B_0$ through an examination region. Gradient magnetic field coils B selectively produce magnetic field gradients transversely across the main magnetic field of the imaging region. An RF transmitter coil C, selectively transmits radio frequency resonance excitation and manipulation pulses during a transmit portion of each transmit/receive cycle. These high power excitation and manipulation pulses excite magnetic resonance in the nuclei of the subject disposed in the imaging region. The resonating nuclei generate radio frequency signals of a frequency that is determined by the strength of the magnetic field and other variables such as the specific nuclei targeted. A magnetic resonance imaging sequence controller 10 is functionally connected to drivers 12 for the gradient coils B and a transmitter 14 for driving the transmit coil C. The sequence control 10 coordinates the generation of, and sequencing for, the gradient and resonance exciting pulse.

In the illustrated embodiment, a first receive coil $D_1$, is semi-permanently embedded within the movable patient couch 16, while a second receive coil $D_2$ is selected and placed in the imaging area only when desired. During a receive portion of each transmit/receive cycle, a selected one of the receive coils, for example $D_2$, passes received RF signals to a receiver 18. An imager 20, such as a two-dimensional Fourier transform imaging processor, reconstructs one or more electronic image representations from the received radio frequency signals that are stored in an image memory 22. Typically, the electronic images are representative of density, position, relaxation time, and other characteristics of the resonating nuclei in each voxel of the imaging volume. A video monitor, flat panel display, or other human readable display mechanism 24 converts portions of the electronic image representation to human readable images.

While the magnetic resonance imaging system has been described with respect to a single frequency horizontally oriented magnetic resonance imaging system, those skilled in the art will appreciate that the principles disclosed are equally applicable to multi-frequency systems, vertically oriented systems, off-axis coils, and the like.

Figure 2:
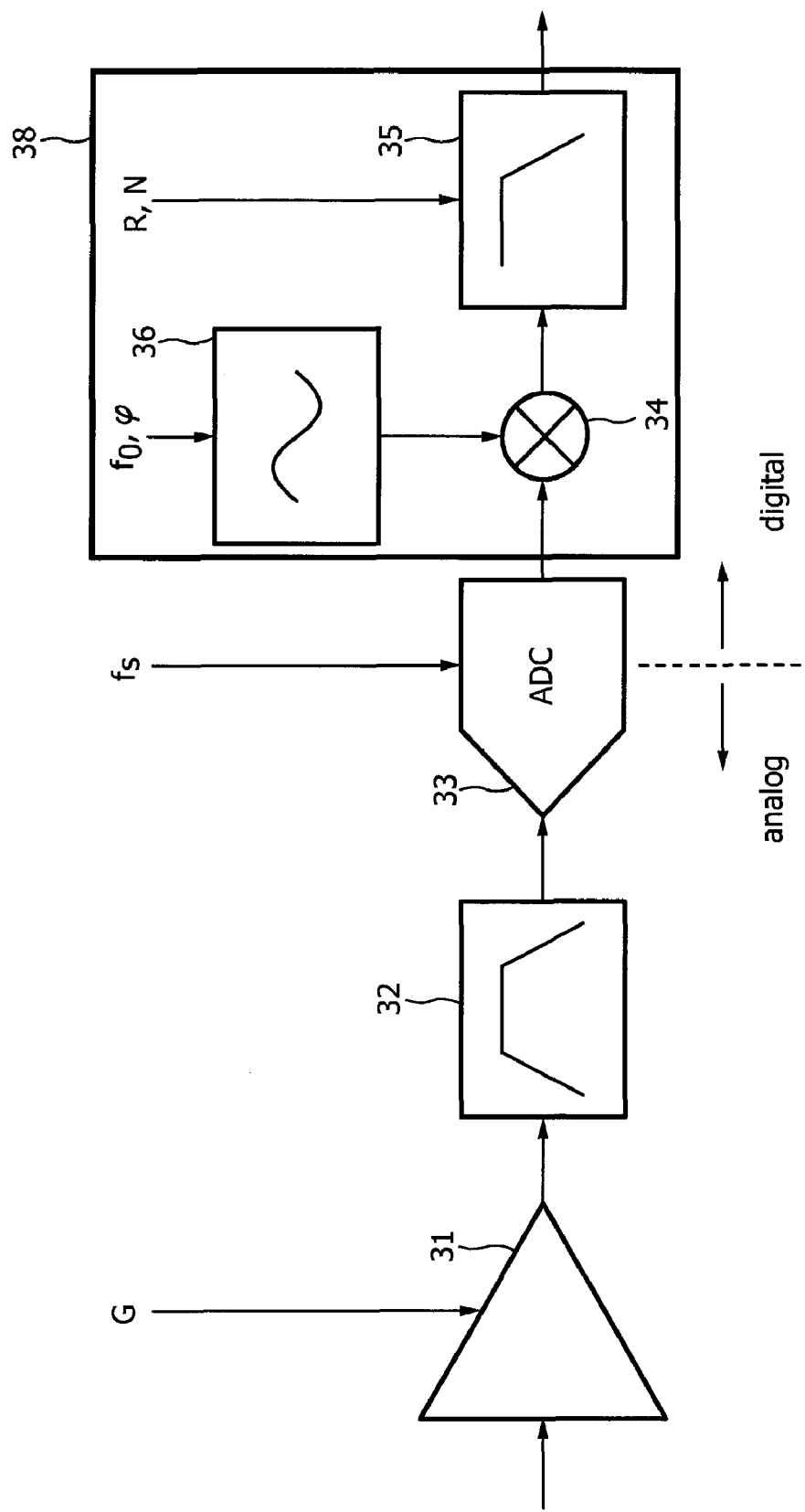
FIG. 2 shows a schematic block diagram of a known direct digital receiver.

A schematic block diagram of a known direct digital receiver (DDR), which can be used as receiver 18 in the MRI apparatus shown in FIG. 1, is shown in FIG. 2. Such a DDR is, for instance, described in US 2002/0079892 A1. It comprises an amplifier 31, a band-pass filter 32, an analog-digital converter (ADC) 33, a demodulator 34, a low-pass filter 35 and an oscillator 36. The demodulator 34, low-pass filter 35 and oscillator 36 together comprise what is commonly referred to as a digital down converter (DDC) 38. For simplicity, the dual-ADC and quadrature detection signal paths are not shown. The receiver parameters are described in the following table.

| Parameter | Description |
| --- | --- |
| $f_C$ | signal carrier frequency ($\leq$200 MHz) |
| BW | signal bandwidth ($\leq$1 MHz) |
| G | amplifier (analog) gain |
| $f_S$ | sample frequency ($\leq$50 MHz) |
| $f_0$ | demodulation frequency |
| $\varphi$ | demodulation phase |
| R | reduction factor (R $\in$ [26,8192]) |
| $N_S$ | number of samples to acquire |

The ADC limits the maximum carrier frequency (i.e., the maximum frequency that the ADC can track) and the maximum sampling frequency. Commercially available low-cost and low-power ADCs allow a maximum carrier frequency of 200 MHz and a maximum sampling frequency of 50 MHz.

The direct digital receiver according to the present invention makes use of the fact that the MR signal bandwidth is (typically much) lower than the MR signal carrier frequency. The MR signal bandwidth (BW) is defined by $\gamma \cdot FOV \cdot \nabla B$ where $\gamma$ is the gyro-magnetic ratio, FOV is the field-of-view and $\nabla B$ is the applied spatial encoding gradient. In a practical MR system it holds that BW$\leq$1.5 MHz.

It shall be noted here that a 1.5 MHz (proton) signal bandwidth at 50 cm FOV would require a 70 mT/m gradient. At such gradient strengths, efficient imaging sequences are not feasible with affordable gradient amplifier power levels and technology. Consequently, 1.5 MHz is (well) above the bandwidth used in practice (typically less than 1 MHz).

The carrier frequency $f_C$ is defined by $\gamma \cdot B_0$ where $B_0$ is the main field strength. In a practical MR system operation is required at 1.5 and 3 tesla or 64 MHz and 128 MHz. The ADC readily enables operation for all nuclei at main field strengths up to 200 MHz/$\gamma_{MAX}\approx$4.7 tesla. This does not allow operation at 7 tesla with a carrier frequency of 300 MHz. Low-cost and low-power ADCs that can track such frequencies are expected to become commercially available in the foreseeable future.

In practice, the sampling frequency must be chosen carefully to avoid aliasing and to facilitate band-pass filter implementation. When undersampling a band-limited signal, aliases appear at even and odd multiples of half the sample frequency. A band-pass filter around the carrier frequency rejects all aliases, allowing only the intended signal bandwidth to pass through to the ADC to be sampled. The band-pass filter must be designed such that it sufficiently rejects signals from aliases, this being the most difficult for aliases nearest the carrier frequency; i.e., the alias directly above and below the signal band.

Figure 3:
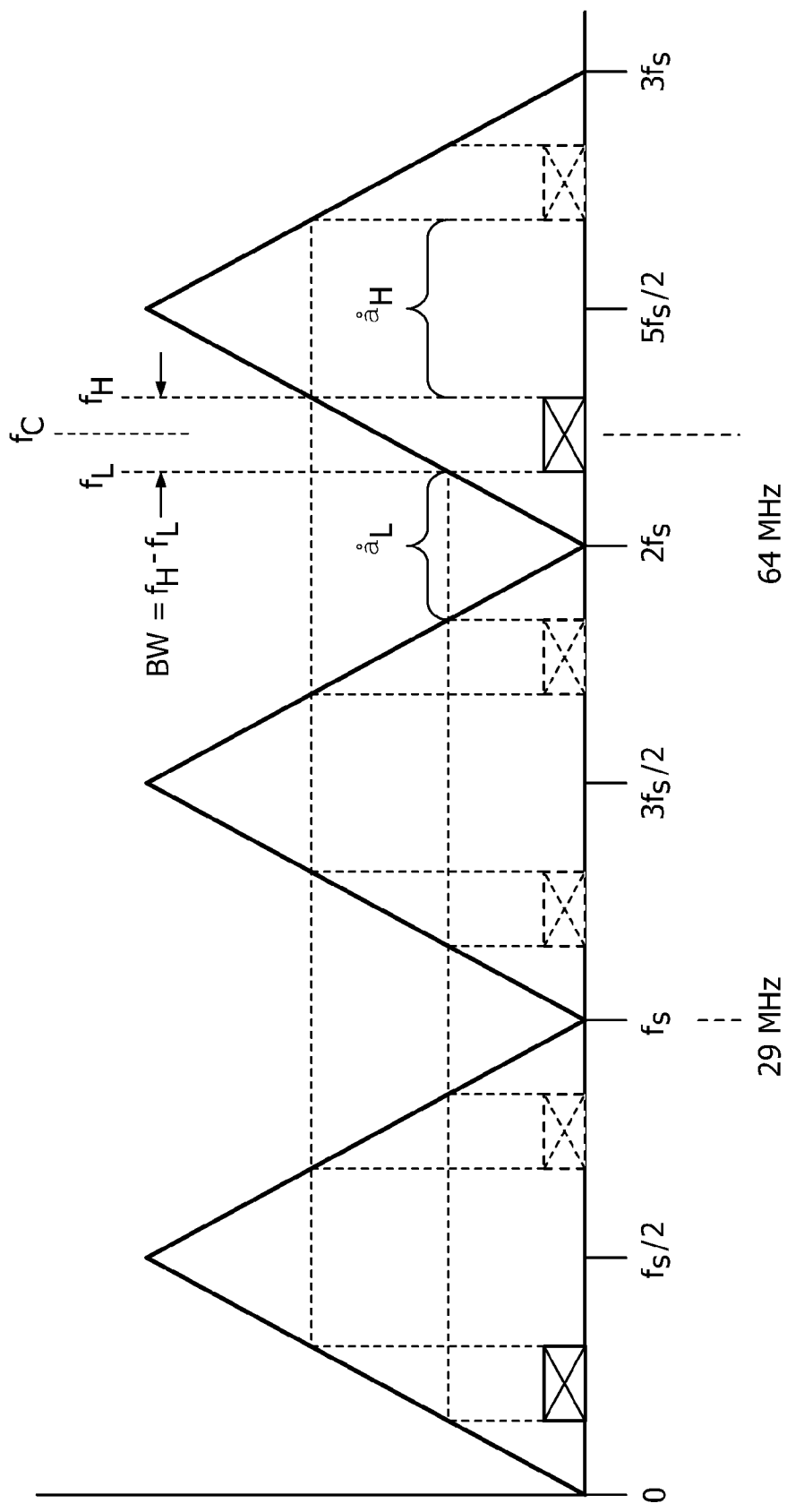
FIG. 3 illustrates band-limited undersampling.

This is illustrated in FIG. 3 showing the effect of undersampling a band-limited signal. The signal bandwidth BW is given by $(f_H-f_L)$ and the carrier frequency $f_C$ by $(f_L+f_H)/2$. The sample frequency must be chosen to avoid an aliased signal band at $f_S/2$ and at $f_S$. To facilitate band-pass filter implementation $f_S$ is chosen to maximize aliased signal band separation $\Delta_L$ and $\Delta_H$.

A measure of how easily a band-pass anti-aliasing filter can be implemented is given by MIN($\Delta_L,\Delta_H$)/$f_C$ where $\Delta_L$ and $\Delta_H$ are the frequency offsets from the signal band to the next lower and next higher alias respectively. The larger this measure, the easier it is to implement the band-pass filter (i.e., the greater the design freedom and least susceptible the implementation is to specific component tolerances). This measure is illustrated as a function of the sampling frequency at 1.5 tesla and 3 tesla in FIGS. 4 and 5.

Figure 4:
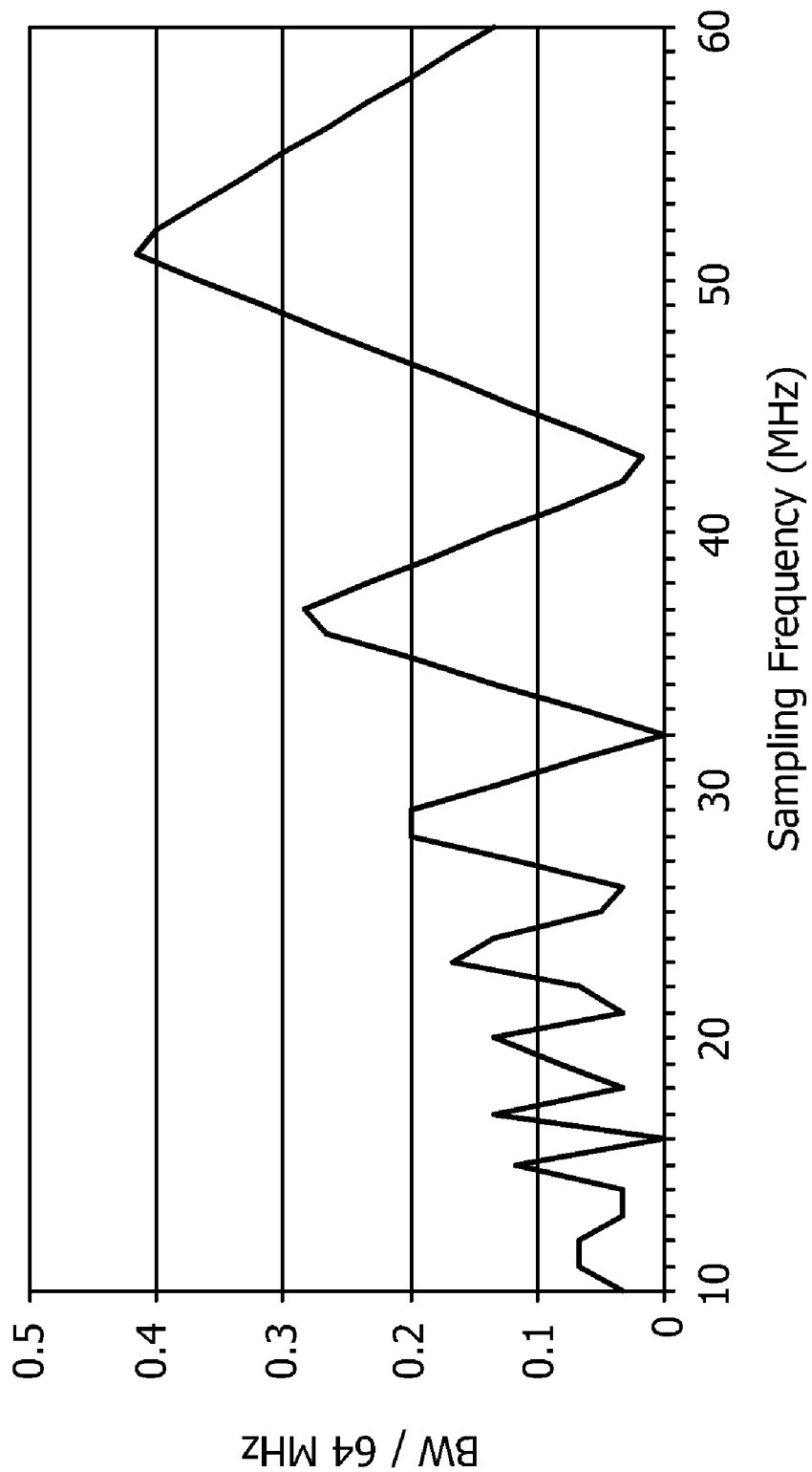
FIG. 4 illustrates the relative anti-aliasing filter bandwidth for MR proton signals at 1.5 T as a function of sampling frequency.

FIG. 4 illustrates the required anti-aliasing filter bandwidth for MR proton signals at 1.5 tesla. The filter bandwidth is expressed as a fraction of the 64 MHz carrier frequency. 28 MHz and 37 MHz are sweet spots that combine a sample frequency less than 50 MHz with a relaxed filter bandwidth requirement.

Figure 5:
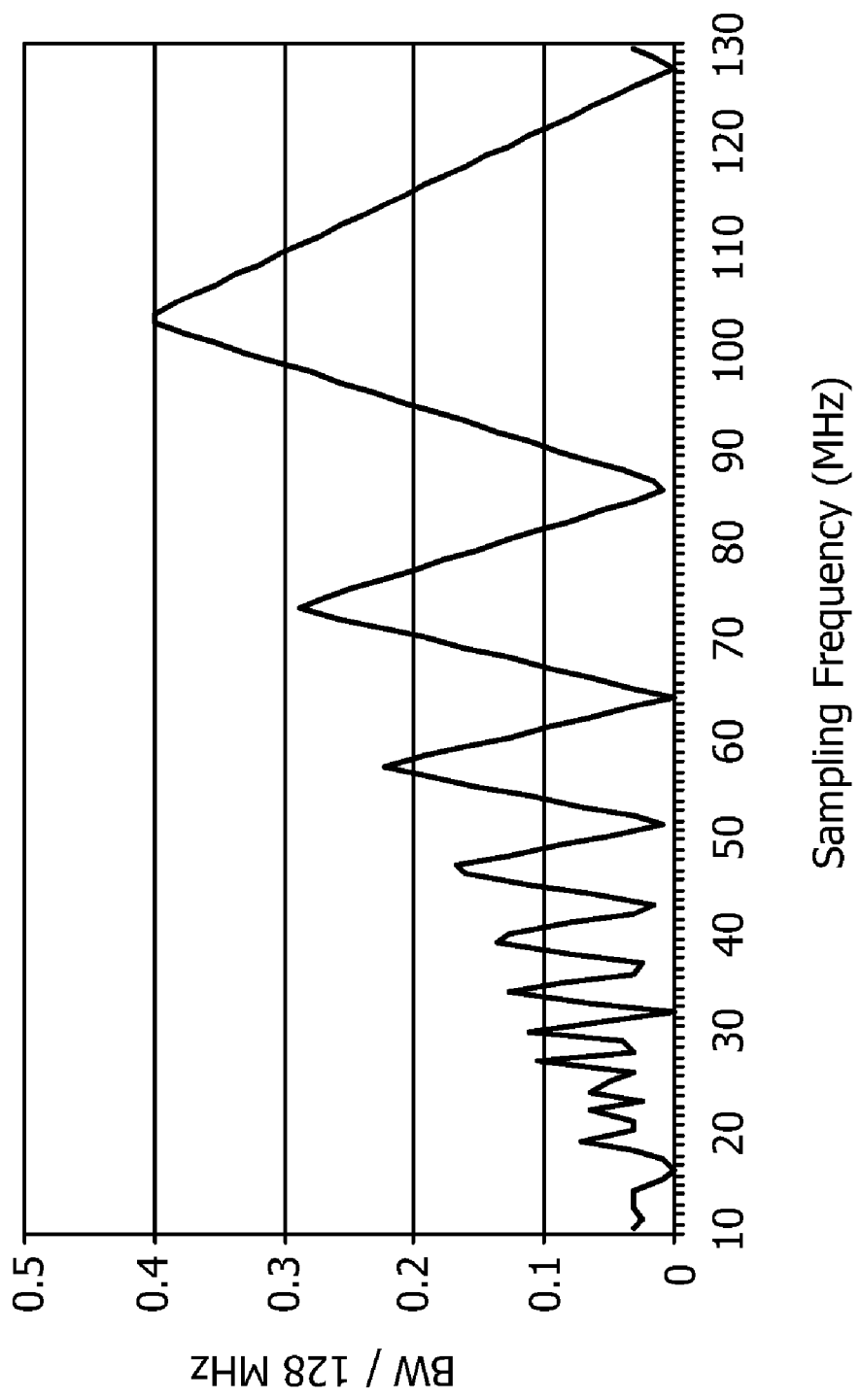
FIG. 5 illustrates the relative anti-aliasing filter bandwidth for MR proton signals at 3 T as a function of sampling frequency.
Figure 6:
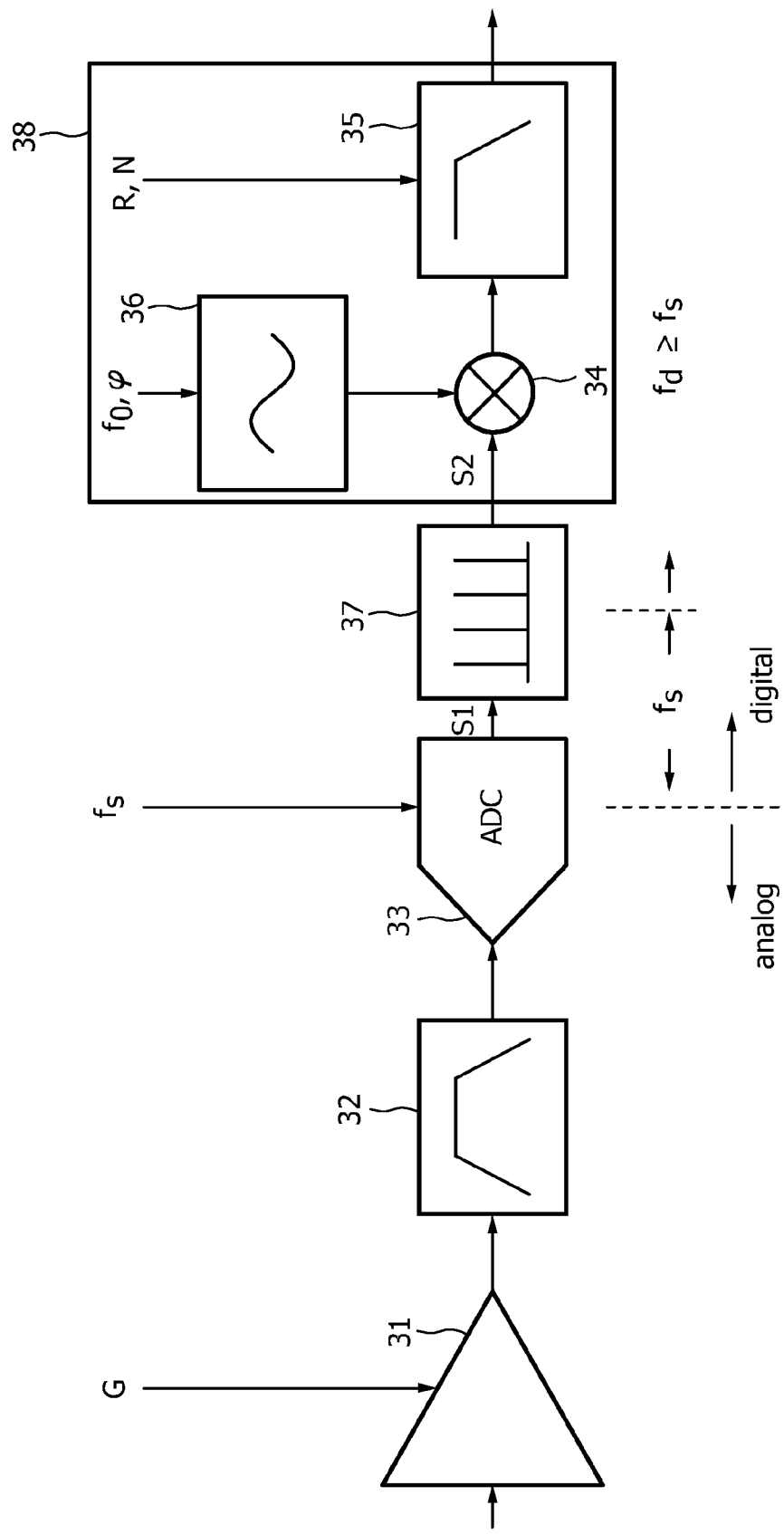
FIG. 6 shows a schematic block diagram of a direct digital receiver according to the present invention.

FIG. 5 illustrates the required anti-aliasing filter bandwidth for MR proton signals at 3 tesla. The filter bandwidth is expressed as a fraction of the 128 MHz carrier frequency. 39 MHz and 47 MHz are sweet spots that combine a sample frequency less than 50 MHz with a relaxed filter bandwidth requirement. Introducing a resampler in the DDR between the ADC and the demodulator allows the sampling frequency of the ADC to be chosen independently of the frequency at which the DDC operates. This independence provides additional design freedom in the analog domain and digital (DDC) domain. This is illustrated in FIG. 6 showing a schematic block diagram of a resampling DDR as proposed according to the present invention. In addition to the known DDR shown in FIG. 2 the resampling DDR comprises a resampler 37 between the ADC 33 and DDC 38, in particular between the ADC 33 and the demodulator 34.

The resampler 37 converts the sampling frequency $f_S$ to the DDC operating frequency $f_D$ by interpolating the incoming ADC samples. To do this, the resampler 37 first transfers samples of the first digital sample signal output from the ADC 33 acquired at the ADC sampling frequency ($f_S$) to the electronics operating at the digital operating frequency ($f_D$) and subsequently interpolates the transferred samples to generate samples of a second digital sample signal at the digital operating frequency. The relative phase of the ADC sampling frequency ($f_S$) with respect to the digital operating frequency—($f_D$) determines when to transfer a sample.

The transfer of information between digital electronics operating at two completely independent frequencies requires careful design to avoid meta-stability problems. As the relative phase of the sample frequency with respect to digital operating frequency is required for the interpolation, it can also be used to determine when to transfer. This principle is illustrated in FIG. 7

Figure 7:
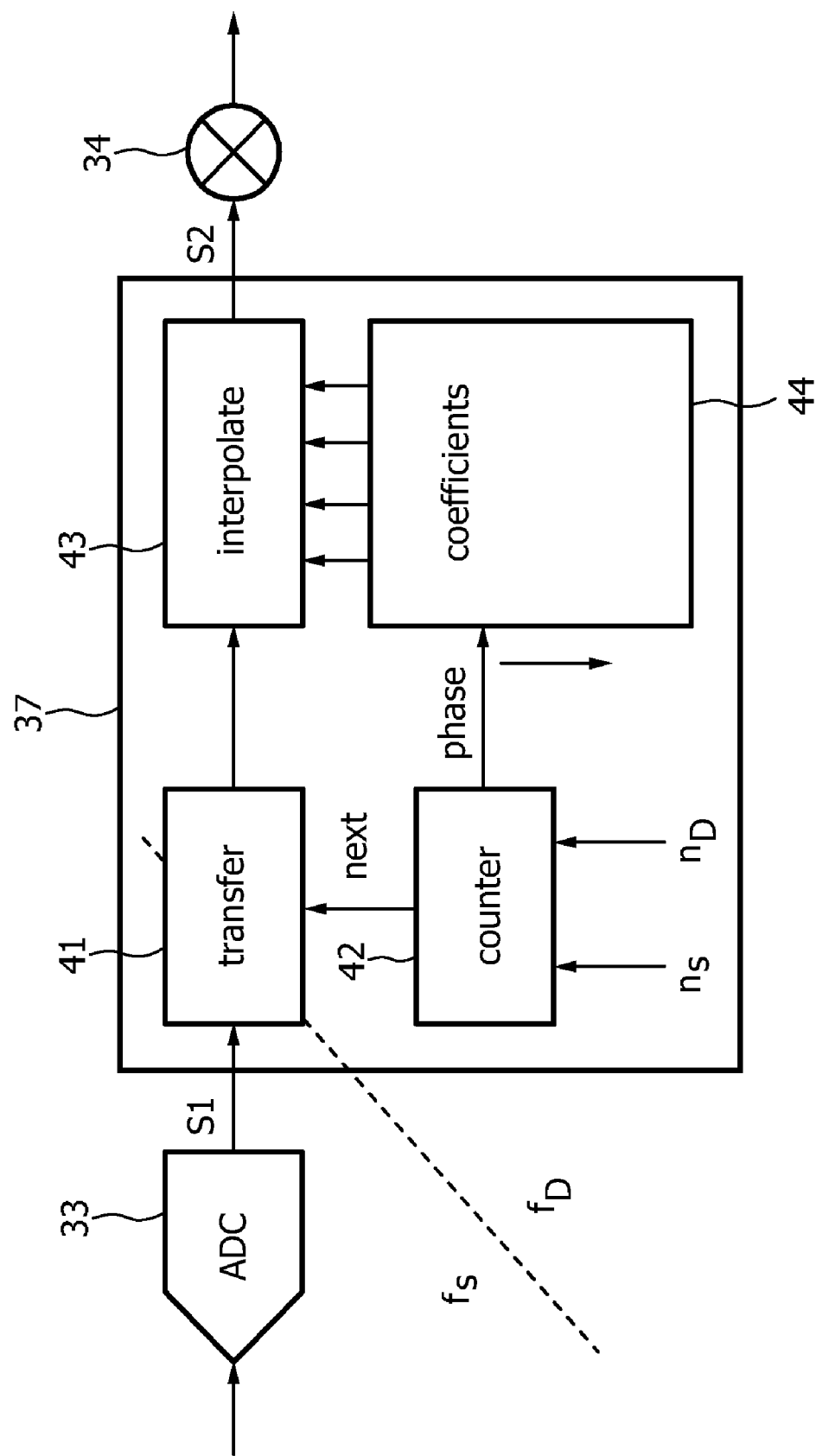
FIG. 7 shows a schematic block diagram of a resampler according to the present invention.

FIG. 7 shows an exemplary implementation of the resampler 7 comprising a sample transfer unit 41, a phase counter 42, an interpolator 43 and a coefficient table unit 44. $n_S$ and $n_D$ define the relation between sampling frequency $f_S$ and $f_D$ respectively. The shown implementation assumes $f_S \leq f_D$. The "next" signal causes a sample to be transferred; the "phase" defines the relative phase of the sampling frequency and the digital operating frequency as well as the corresponding index in the coefficient table to retrieve coefficients required for interpolation. The interpolation can be implemented as a 4-tap FIR filter.

The frequencies $f_S$ and $f_D$ can be characterized by two integer values $n_S$ and $n_D$ expressed in the frequency resolution. For example, for $f_D$ at 50 MHz and $f_S$ at 37 MHz and a frequency resolution of 1 MHz, it results that $n_D$=50 and $n_S$=37. A 1 MHz frequency resolution is sufficient for the operating range envisioned for practical systems ($f_S \in$ [1,50] MHz and $f_D$=50 MHz).

Figure 8:
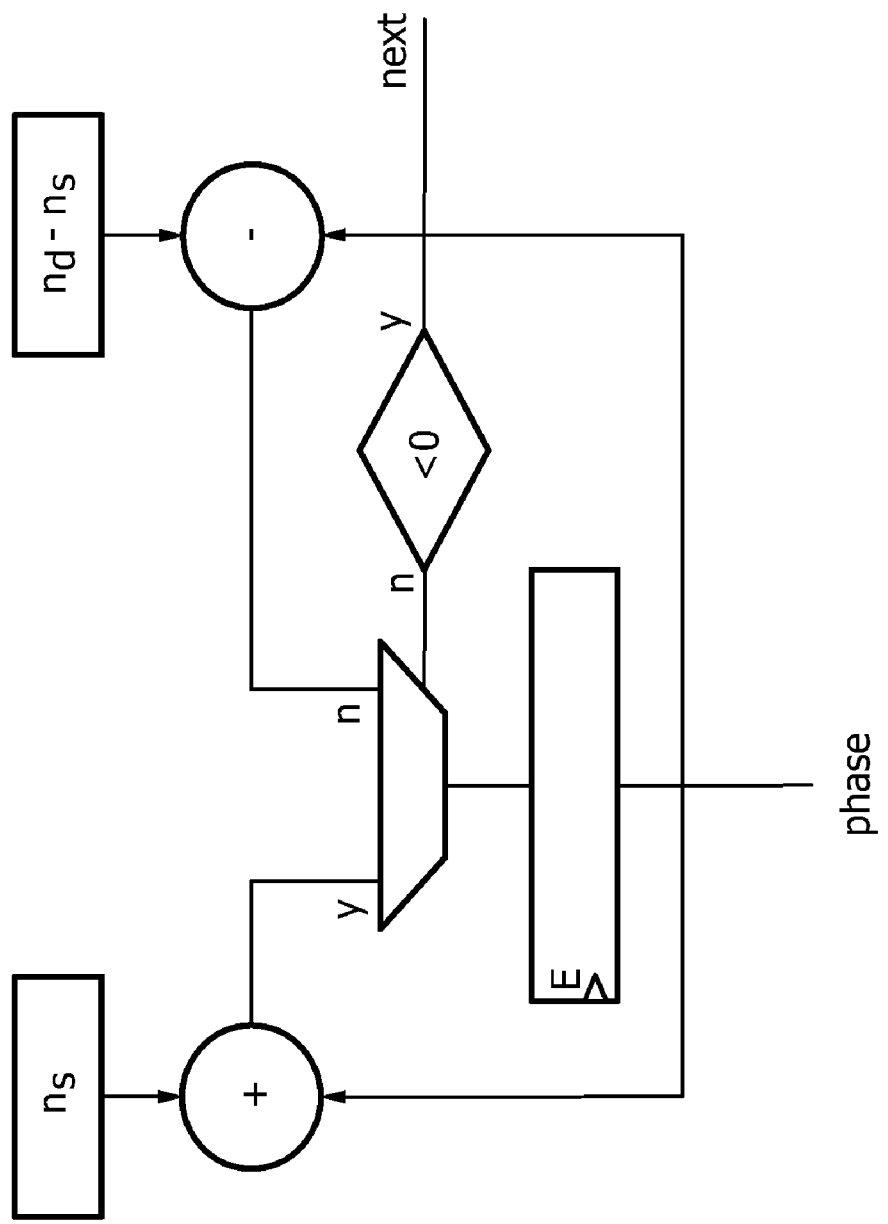
FIG. 8 shows an embodiment of a phase counter.

An embodiment of the phase counter logic is schematically shown in FIG. 8. The phase is incremented by $n_S$ when less than ($n_D$–$n_S$) and decremented by ($n_D$–$n_S$) when greater than or equal to ($n_D$–$n_S$).

The phase counter logic can be expressed in C code as:

```
next = (phase < n_S) ? 1 : 0
phase += (phase < (n_d - n_S)) ? n_S : (n_S - n_d)
```

Effectively, the phase counter decrements by ($n_D$–$n_S$) until it underflows at which point it increments by $n_S$. The phase counter steps through all possible phases defined by $n_S$ and $n_D$. The following table shows the phase counter behavior for $n_S$=7 and $n_D$=10.

| phase | next |
|---|---|
| 0 | 1 |
| 7 | 0 |
| 4 | 1 |
| 1 | 1 |

| phase | next |
|---|---|
| 8 | 0 |
| 5 | 1 |
| 2 | 1 |
| 9 | 0 |
| 6 | 1 |
| 3 | 1 |

If $n_S$ is prime (relative to $n_D$), then the phase counter will step through the entire range [0,$n_D$). For example, $n_S$=37 and $n_D$=50.

Figure 9:
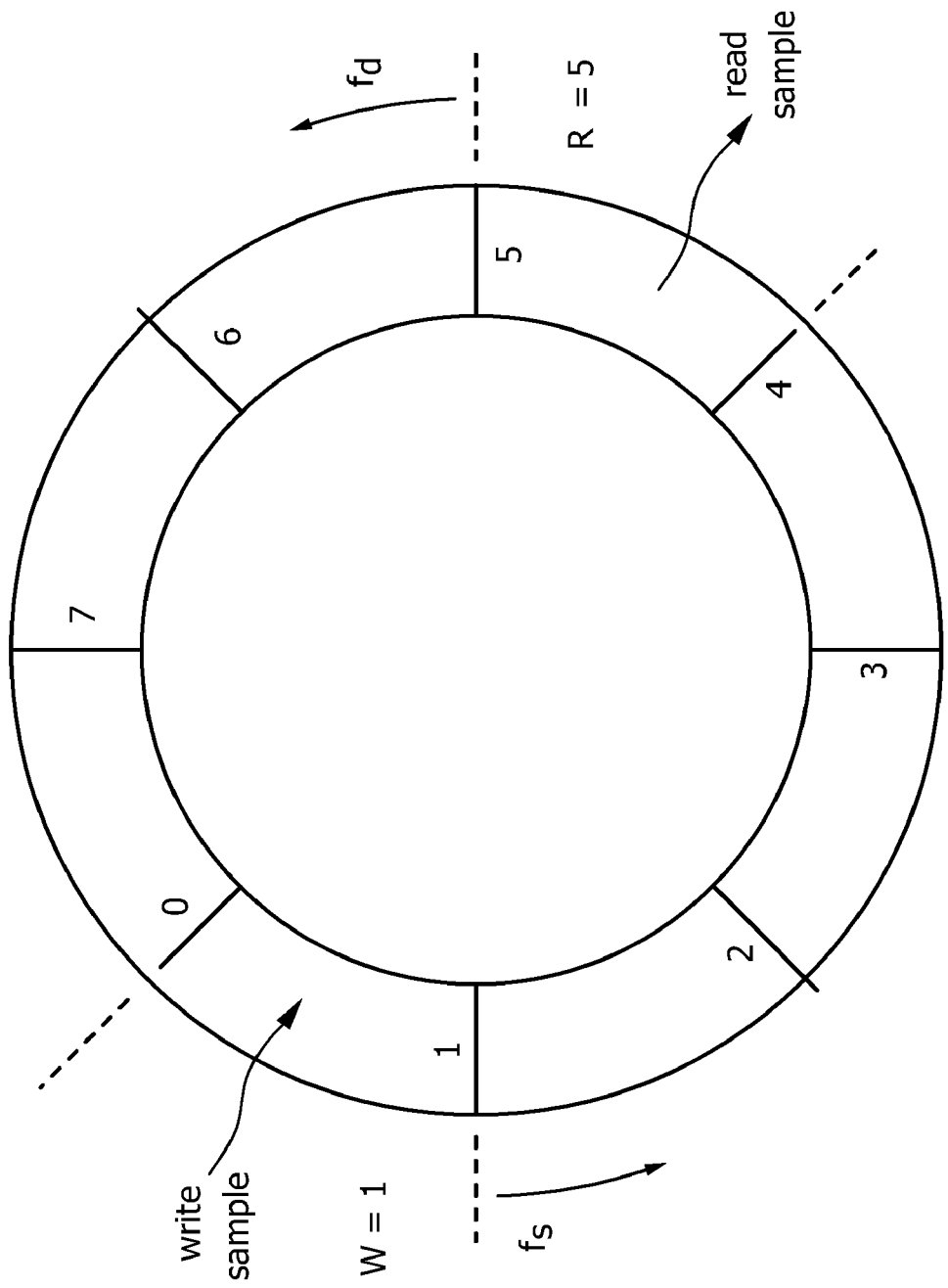
FIG. 9 shows an embodiment such an eight entry circular buffer for sample transfer.

The actual sample transfer may be realized by a (small) circular buffer. FIG. 9 shows an embodiment such an eight entry circular buffer for sample transfer. Samples are written into the buffer at the ADC sampling frequency $f_S$. Samples are read out of the buffer at the digital operating frequency but conditional on the value of next.

Figure 10:
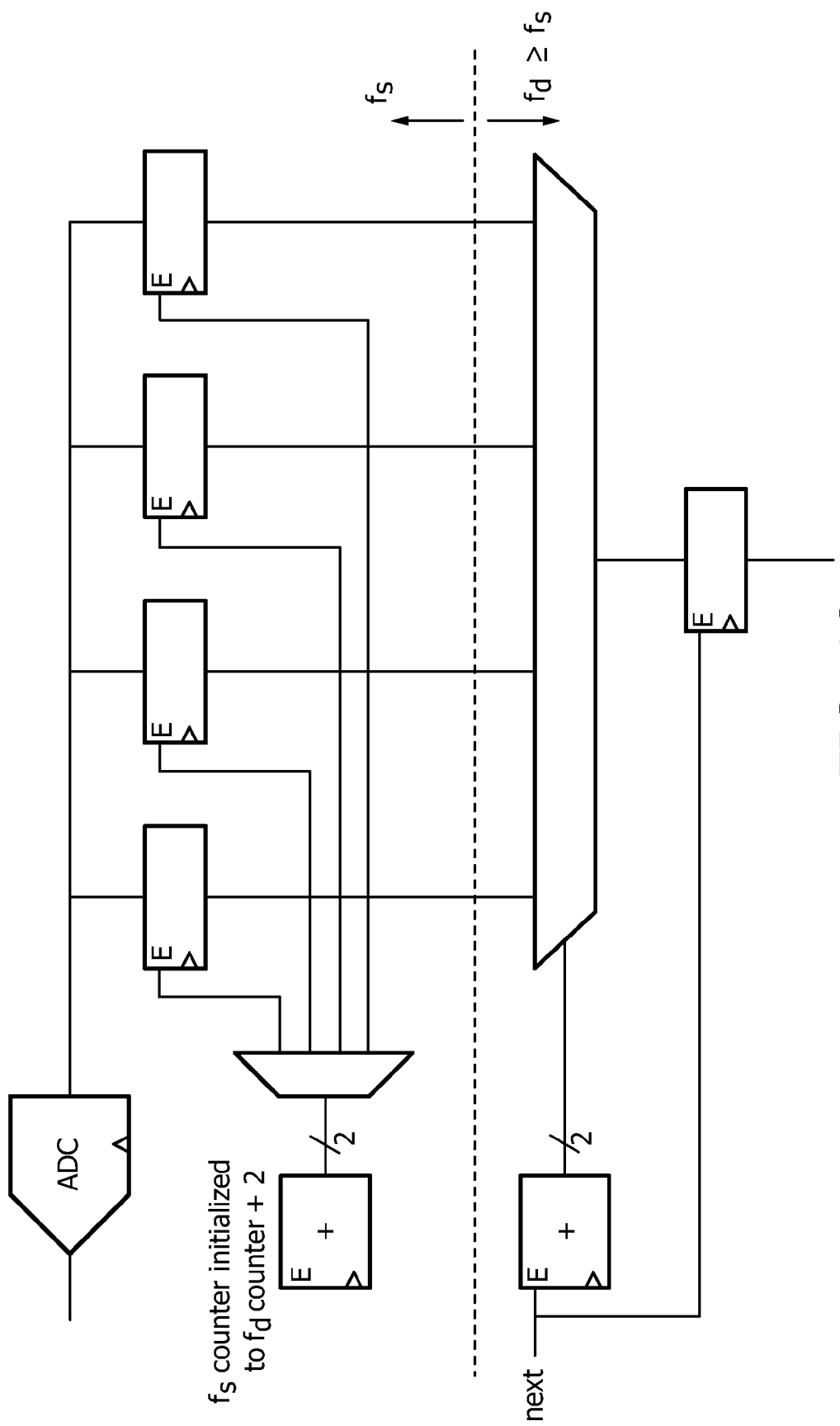
FIG. 10 shows an embodiment such a four entry circular buffer for sample transfer.

The write pointer and read pointer are initialized to half the size of the circular buffer from each other. This maximizes the distance between the two. The size of the circular buffer can be chosen to avoid meta-stability problems. With an asynchronous reset, both pointers may potentially be off by one requiring a circular buffer of at least four entries, as for instance shown in FIG. 10. An eight-entry buffer is probably sufficient. Increasing the size of the buffer will increase the latency of the resampler (and consequently the entire receiver).

Figure 11:
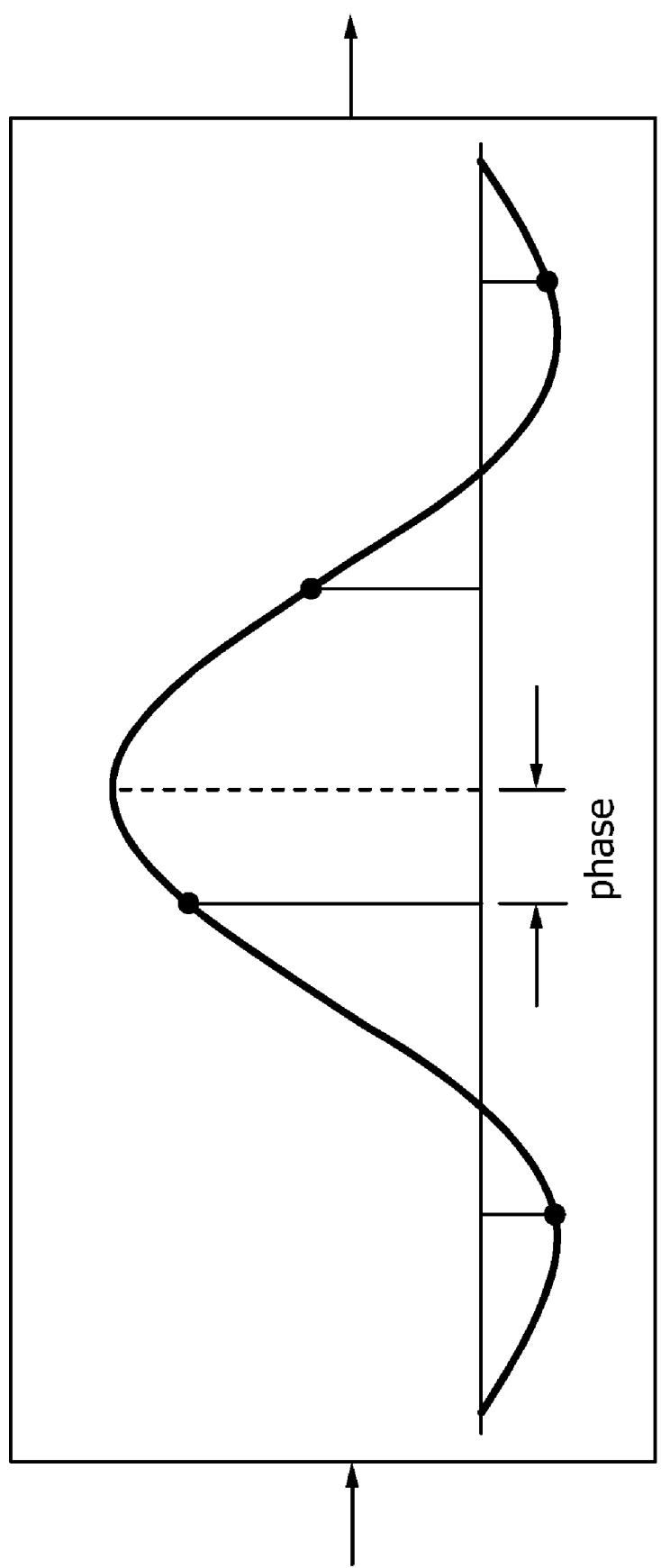
FIG. 11 shows 4-tap FIR filter that can be used for maintaining the signal quality during interpolation.

The signal quality must be maintained during interpolation. This is readily achieved with a multi-tap FIR filter. A 4-tap filter, as for instance shown in FIG. 11, where the origin of the filter on the sample grid defines the sample positions (phase) ("cubic-spline interpolation with fixed shift") can be used for practical systems.

Figure 12:
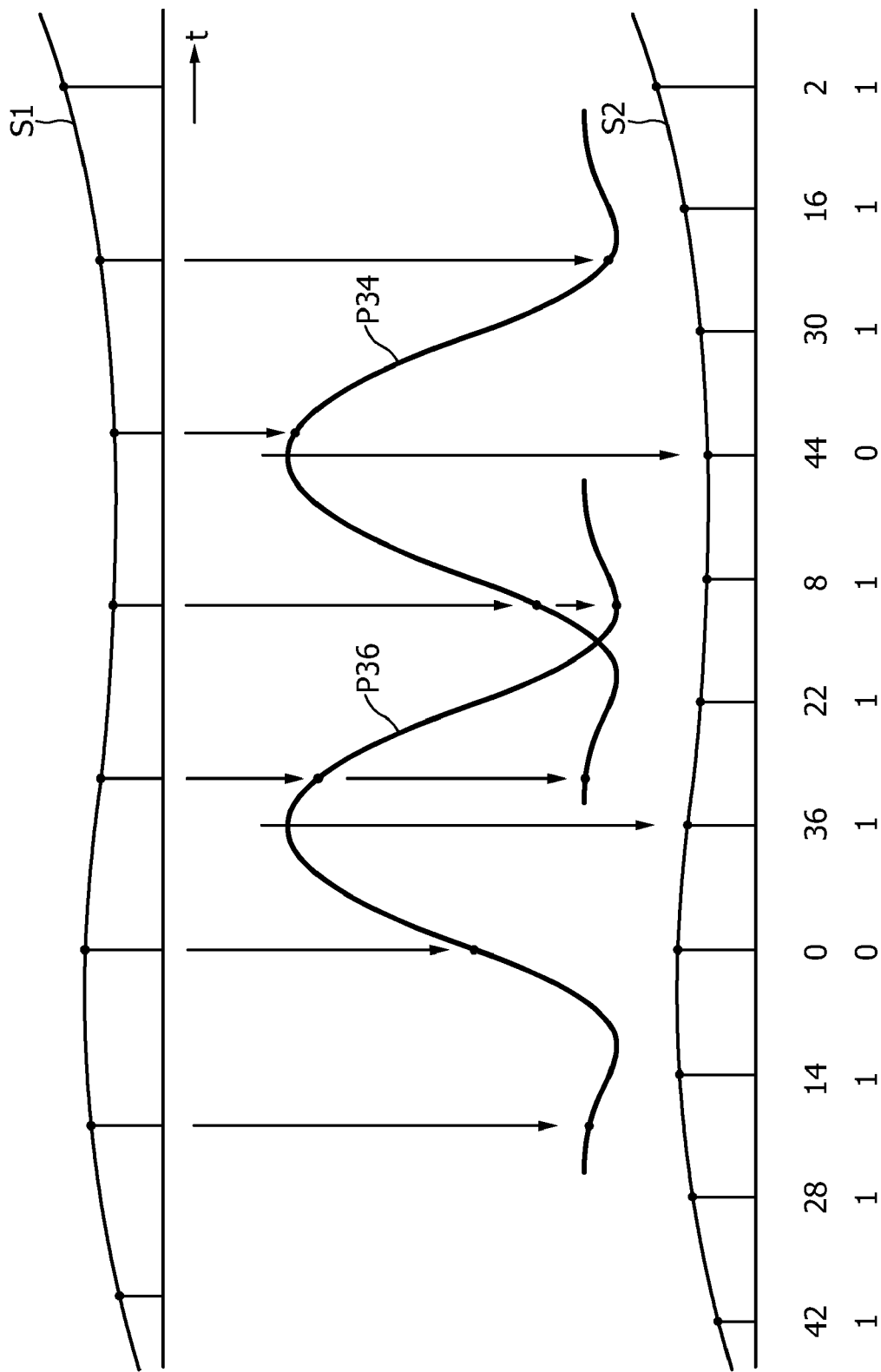
FIG. 12 shows a diagram of examplary signals for illustrating the present invention.

FIG. 12 shows a diagram of examplary signals for illustrating the present invention. It is shown at the top a signal, sampled at 36 MHz as first digital sample signal S1, at the bottom the same signal, sampled at 50 Mhz as second digital sample signal S2, and in between the resampling function and associated coefficients. At the bottom are the "phase" and "next" values for each 50 MHz sample. The resampling function and coefficients are only illustrated for phases 36 and 44 corresponding to the 5th and 8th 50 Mhz sample respectively.

As can be seen the "phase" defines the position of the resampling function with respect to the 50 MHz sample grid and therefore also defines which coefficients to apply. The resampling is, in this example, implemented as a four-point function (i.e., 4-tap FIR filter) and as such extends over four 36 MHz input samples. It is to be noted how the "next" signal is 1 for each 50 MHz sample for which an additional 36 MHz sample is required to evaluate the resampling function.

According to the present invention the ADC sample frequency is matched to the signal carrier frequency to maximize the distance between primary images, mirror images and their aliases facilitating signal conditioning prior to sampling. Preferably the digital down converter is operated at an integer multiple of the frequency associated with the pulse sequence timing raster. In the systems according to the present invention this raster is 100 ns or 10 MHz, which is used to define RF-transmit pulses, gradient waveforms and RF-signal reception. The use of a single timing raster for all MR pulse sequence controls is not fundamental but does greatly facilitate the implementation of control hardware and corresponding control software. This is in fact an additional (secondary) reason for being able to choose the sampling frequency independently of the demodulation frequency. It is generally also possible to operate the digital down converter at the sampling frequency (and avoid resampling) but this would be a constraint in defining digital down converter timing as this must be phase coherent or time aligned with both the RF-transmit pulses and the gradient waveforms.

Low frequency sampling is enabled leading to low demands on the ADC performance, low demands on DDC performance and low power. The signal integrity is maintained by a quality interpolation.

The meta-stability in the transfer is controlled by initializing the offset between the read and write pointer and defining an appropriate size of circular buffer. Normalizing discrete coefficient values is achieved by that the sum of the normalized discrete coefficient values for a specific phase may be off by one bit and by adjusting the value with the largest error. A ROM table is generally sufficient for fixed sampling frequency and digital operating frequencies. Further, due to symmetry it is only needed to store half the coefficients. The phase counter and coefficient table can be shared over channels if $f_S$ is the same for all channels.

In summary, the problem underlying the present invention is related to the design of the anti-aliasing (bandpass) filter 32. Under bandwidth-limited undersampling image mirrors appear in the spectrum (as illustrated in FIG. 3). The design of the anti-aliasing filter is relaxed if the sampling frequency can be freely chosen to a frequency that maximizes the distance between the actual signal and its nearest mirrors. A measure of the ease with which such a bandpass filter can be designed/implemented has been explained above and illustrated in FIGS. 4 and 5 for 1.5 T & 3 T respectively. An additional requirement is the ability to able to provide phase-continuous demodulation (frequency and phase of the DDC 38) synchronized with RF-transmit and gradient control functions. This requires a single time-base for all such control functions. A single time base severely restricts the choice of possible sampling frequencies if the sample frequency is the same as the frequency at which the DDC operates as is the case in the known DDCs. Thus, being able to choose the sample frequency independently of the DDC operating frequency provides significant advantages in the design of the MR receiver. The present invention provides a resampling technique used in integrated RF (iRF) enabling the sampling frequency of the analog-to-digital converter and the operating frequency of the subsequent digital down converter to be chosen independently leading to the desired advantages.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or several units may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. Magnetic resonance imaging system having a transmit phase and a receive phase, comprising:
   an RF receive coil, adapted to resonate in the resonant frequency spectrum, for receiving a magnetic resonance signal during the receive phase; and
   a direct digital receiver for converting said received magnetic resonance signal to a digital base-band signal, including:
   an analog-to-digital converter for converting said received signal to a first digital sample signal at a sampling frequency,
   a digital down converter for down-mixing a second digital sample signal to a bandwidth limited digital base-band signal having a digital operating frequency, and
   a resampling unit coupled between said analog-to-digital converter and said digital down converter for resampling said first digital sample signal at said sampling frequency to said second digital sample signal at said digital operating frequency, wherein said resampling unit is adapted for resampling said sampling frequency to said digital operating frequency by
   i) transferring the samples of said digital sampled signal to said digital operating frequency domain using the relative phase of the sampling frequency with respect to the digital operating frequency to determine when to transfer a sample and
   ii) interpolating said transferred samples for generating a stream of samples at the digital operating frequency.

2. Magnetic resonance imaging system as claimed in claim 1, wherein said resampling unit comprises a circular buffer, in particular an eight entry circular buffer for said sample transfer.

3. Magnetic resonance imaging system as claimed in claim 1, wherein said resampling unit comprises a multi-tap FIR filter, in particular a 4-tap FIR filter for maintaining signal quality during said interpolation.

4. Magnetic resonance imaging system as claimed in claim 1, wherein said digital down converter comprises a demodulator, a low-pass filter and an oscillator.

5. Magnetic resonance imaging system having a transmit phase and a receive phase, comprising:
   an RF receive coil, adapted to resonate in the resonant frequency spectrum, for receiving a magnetic resonance signal during the receive phase; and
   a direct digital receiver for converting said received magnetic resonance signal to a digital base-band signal, including:
   an analog-to-digital converter for converting said received signal to a first digital sample signal at a sampling frequency,
   a digital down converter for down-mixing a second digital sample signal to a bandwidth limited digital base-band signal having a digital operating frequency, and
   a resampling unit coupled between said analog-to-digital converter and said digital down converter for resampling said first digital sample signal at said sampling frequency to said second digital sample signal at said digital operating frequency, wherein said resampling unit comprises
   a transfer unit coupled to the output of said analog-to-digital converter for receiving said digital sampled signal and to the output of a counter unit for outputting a next signal causing a transfer of a sample, said transfer unit being adapted for transferring the samples of said digital sampled signal to said digital operating frequency domain, an interpolation unit coupled to the output of said transfer unit for receiving transferred samples and to the output of a coefficient table unit for receiving coefficients required for interpolation of the received samples, said interpolation unit being adapted for interpolating the received transferred samples and for outputting the interpolated samples, a counting unit for receiving indications regarding the relations between the sampling frequency and the digital operating frequency, said counting unit being adapted for outputting a next signal to said transfer unit causing a sample to be transferred and a phase signal defining the phase relation between the sampling frequency domain and the digital operating frequency domain to a coefficient table unit, a coefficient table unit coupled to the output of said counting unit, said coefficient table unit being adapted for receiving said phase signal and for outputting said coefficients required for the interpolation.

6. Magnetic resonance imaging method having a transmit phase and a receive phase comprising the steps of receiving a magnetic resonance signal during the receive phase; and converting said received magnetic resonance signal to a digital base-band signal, including:

converting said received signal to a first digital sample signal at a sampling frequency, down-mixing a second digital sample signal to a bandwidth limited digital base-band signal having a digital operating frequency, and resampling said first digital sample signal at said sampling frequency to said second digital sample signal at said digital operating frequency by i) transferring the samples of said digital sampled signal to said digital operating frequency domain using the relative phase of the sampling frequency with respect to the digital operating frequency to determine when to transfer a sample and ii) interpolating said transferred samples for generating a stream of samples at the digital operating frequency.

7. Direct digital receiver for an RF coil, in particular of a magnetic resonance imaging system, comprising an analog-to-digital converter for converting said received signal to a first digital sample signal at a sampling frequency, a digital down converter for down-mixing a second digital sample signal to a bandwidth limited digital base-band signal having a digital operating frequency, and a resampling unit coupled between said analog-to-digital converter and said digital down converter for resampling said first digital sample signal at said sampling frequency to said second digital sample signal at said digital operating frequency, wherein said resampling unit is adapted for resampling said sampling frequency to said digital operating frequency by i) transferring the samples of said digital sampled signal to said digital operating frequency domain using the relative phase of the sampling frequency with respect to the digital operating frequency to determine when to transfer a sample and ii) interpolating said transferred samples for generating a stream of samples at the digital operating frequency.

8. Direct digital receiving method for an RF coil, in particular of a magnetic resonance imaging system, comprising the steps of converting said received signal to a first digital sample signal at a sampling frequency, down-mixing a second digital sample signal to a bandwidth limited digital base-band signal having a digital operating frequency, and resampling said first digital sample signal at said sampling frequency to said second digital sample signal at said digital operating frequency by i) transferring the samples of said digital sampled signal to said digital operating frequency domain using the relative phase of the sampling frequency with respect to the digital operating frequency to determine when to transfer a sample and ii) interpolating said transferred samples for generating a stream of samples at the digital operating frequency.

* * * * *